United States Patent [19]

Klassen et al.

[11] Patent Number: 5,268,644
[45] Date of Patent: Dec. 7, 1993

[54] FAULT DETECTION AND ISOLATION IN AUTOMOTIVE WIRING HARNESS BY TIME-DOMAIN REFLECTOMETRY

[75] Inventors: David J. Klassen, Dearborn; Edward G. Anderson, Bloomfield Hills, both of Mich.

[73] Assignee: Ford Motor Company, Dearborn, Mich.

[21] Appl. No.: 504,451

[22] Filed: Apr. 3, 1990

[51] Int. Cl.$^5$ .............................................. G01R 31/11
[52] U.S. Cl. .................................. 324/503; 324/532; 324/533; 324/538
[58] Field of Search .............. 324/503, 527, 532, 533, 324/534, 535, 538, 539, 541, 542

[56] References Cited

U.S. PATENT DOCUMENTS

| | | | |
|---|---|---|---|
| 3,244,975 | 4/1966 | Bauer | 324/533 |
| 3,607,535 | 9/1971 | Paine et al. | 324/52 |
| 3,699,438 | 10/1972 | Webb | 324/66 |
| 3,718,859 | 2/1973 | Arlaw | 324/72.5 |
| 3,728,616 | 4/1973 | Cheek et al. | 324/51 |
| 3,750,012 | 7/1973 | Fellers et al. | 324/527 X |
| 3,781,665 | 12/1973 | Gale | 324/533 |
| 4,042,832 | 8/1977 | Cassirino, Jr. et al. | 307/149 |
| 4,218,745 | 8/1980 | Perkins | 364/489 |
| 4,257,002 | 3/1981 | Helms et al. | 324/66 |
| 4,271,388 | 6/1981 | Schaling | 324/51 |
| 4,322,677 | 3/1982 | Wright | 324/52 |
| 4,399,400 | 8/1983 | Rockwell et al. | 324/51 |
| 4,404,514 | 9/1983 | Reichert, Jr. | 324/52 |
| 4,527,113 | 7/1985 | Hillerich | 324/533 |
| 4,538,103 | 8/1985 | Cappon | 324/52 |
| 4,689,551 | 8/1987 | Ryan et al. | 324/51 |
| 4,766,386 | 8/1988 | Oliver et al. | 324/533 |
| 4,812,752 | 3/1989 | Preuss | 324/542 |
| 4,859,953 | 8/1989 | Young et al. | 324/539 |
| 4,949,076 | 8/1990 | Wann | 324/533 X |
| 4,998,069 | 3/1991 | Nguyen et al. | 324/539 |
| 5,066,919 | 11/1991 | Klassen et al. | 324/538 |

FOREIGN PATENT DOCUMENTS

0164570A2  7/1985  European Pat. Off. .

*Primary Examiner*—Kenneth A. Wieder
*Assistant Examiner*—Glenn W. Brown
*Attorney, Agent, or Firm*—Mark Mollon; Roger L. May

[57] ABSTRACT

An automotive electrical system including a wiring harness incorporates the dedicated test line passing through critical connectors and components for allowing detection and isolation of improperly connected connectors. The dedicated test line can feed through expansion connectors, termination connectors, and junction blocks. Connector fault detection and isolation is achieved using time-domain reflectometry after final assembly, during vehicle servicing, or on-board during vehicle usage. A large number of expensive and inconvenient vehicle quits and tow-in's are avoided that would otherwise occur.

12 Claims, 4 Drawing Sheets

MEASUREMENT NUMBER

| TIME SLOT | | $m_1$ | $m_2$ | $m_3$ | $m_4$ | $m_5$ | $m_6$ |
|---|---|---|---|---|---|---|---|
| | $t_1$ | .1 | .1 | .13 | .17 | .2 | .25 |
| | $t_2$ | — | — | — | — | — | — |
| | $t_3$ | — | — | — | — | — | — |
| | $t_4$ | — | — | — | — | — | — |
| | $t_5$ | — | — | — | — | — | — |

FIG. 10

FAULT DETECTION AND ISOLATION IN AUTOMOTIVE WIRING HARNESS BY TIME-DOMAIN REFLECTOMETRY

CROSS-REFERENCE TO RELATED APPLICATIONS

This application is related to copending and commonly assigned U.S. application Ser. No. 07/504,458, now U.S. Pat. No. 5,066,919, and U.S. application Ser. No. 07/504,502, both filed on the same date as this application.

BACKGROUND OF THE INVENTION

The present invention relates in general to the detection and isolation of interconnect faults in an automotive wiring system, and more specifically to the application of pulse signals to a dedicated test line included in the wiring harness and the monitoring of reflections of the pulse signals from impedances in the test line to determine the existence and/or location of improperly connected connectors.

The electrical interconnect system of an automobile takes the form of a wiring harness which is normally partitioned into segments. Each segment includes a number of individual conductors. Individual segments are joined by electrical connectors at either end. Furthermore, an individual conductor or conductors may leave the main bundle of wires in a particular segment to form a subsegment which extends to another connector. The shape of the wiring system is irregular and cannot normally be classified as a star, ring or other regular configuration.

Because of the segmented structure of a wiring harness, point-to-point connections between the electrical system load devices interconnected in the wiring system normally include many connectors and conductor segments. These connectors include expansion connectors, termination connectors, and junction blocks. An expansion connector interconnects the partitioned segments of the wiring harness, i.e., expands the wiring harness. Termination connectors interconnect the electrical devices of the vehicle with the wiring harness system, i.e., at terminations of the wiring harness segments. Thus, the electrical devices are referred to as termination devices. A junction block is a device for cross-connecting wiring harness segments, electrical system devices, individual wiring harness conductor wires, and other junction blocks. The conductors and connectors of the wiring harness system can be either electrical, optical, or both.

Improperly connected or nonconnected connectors result in the partial or complete failure of an electrical device or devices connected to the electrical system. Failure of a critical electrical system component may cause the vehicle to quit (i.e., lose drivability) which often requires the vehicle to be towed in for service. Interconnect problems that may inadvertently be present include both complete failures to properly interconnect connectors and partial interconnect failures such as when connectors are not fully inserted to their snap-lock position. These interconnect problems may not become apparent until extended use of the electrical system causes damage to an improperly connected device or until vibrations cause a partially connected connector to separate.

In order to maximize vehicle reliability and to minimize warranty and repair costs, it is desirable to reduce interconnect faults by detecting and isolating their occurrence. A simple and inexpensive system is needed which is adaptable to testing after final assembly, testing during service, and monitoring and fault prediction during vehicle use. Prior art wiring harness testing apparatus are complex and are not readily adaptable to testing under all circumstances.

U.S. Pat. No. 4,689,551, issued to Ryan et al, discloses a wiring harness testing apparatus which tests for proper assembly of the wiring harness itself, i.e., before the prefabricated harness is installed into a vehicle and before the termination connectors of the harness are connected to the vehicle electrical components. The termination connectors of the harness must be plugged into the testing apparatus or to a special adaptor for testing. Each wire in the harness being tested is connected at one end to a current source and at the other end to ground by switches in the testing apparatus that are connected to each wire. Since the testing apparatus must be connected to the termination connectors of the wiring harness, the tests are not possible after the wiring harness is connected into the vehicle electrical system.

European patent application 164570, in the name of Goto et al, discloses a wiring harness checker wherein a checker connects to each termination connector of the wiring harness being tested. The checker is connected to the harness on a test table and checks the conduction of individual conductors in the harness in both or either direction. Thus, the checker is useful only for testing before final assembly since there is no ability to check the harness after it is connected to the electrical components in the vehicle.

U.S. Pat. No. 4,271,388, issued to Schaling, discloses another testing apparatus requiring direct connection of the tester to the conductors and connectors of the cable set being tested. Shift registers are connected to one end of each conductor or connector to be tested. Light emitting diodes and logic circuits connected to the other end of each conductor or connector monitors signals received from the shift registers and indicate the correct or incorrect assembly of the wiring harness itself. Thus, the tester is suitable for testing only before final assembly with the electrical system components of the vehicle.

U.S. Pat. No. 3,718,859, issued to Arlow, discloses a test element in the form of a connector insert which allows monitoring of individual conductors while a wiring harness is interconnected and in operation. The test element plugs into and interconnects the pins of a pair of connectors. The test element includes terminals on its outer surface, each terminal being electrically connected to one of the connector pins and thus to one of the individual conductors of the wiring harness. The terminals may be contacted by a meter to monitor a signal on the corresponding individual conductor. Therefore, the individual conductor can only be tested when the corresponding electrical device is energized. Furthermore, the failure to monitor an expected signal from a conductor does not reveal the location or reason for the occurrence of the fault.

These are some of the deficiencies which the present invention overcomes.

Copending application Ser. No. 07/504,502 teaches a modified automobile electrical system including a dedicated test line in at least a portion of the electrical system. The dedicated test line includes additional conductors in the wiring harness and dedicated and modified connector components. By examining terminal characteristics of the dedicated test line after final assembly of the electrical system, faults in the interconnection of harness expansion connectors and termination connectors are detected and their location isolated. Thus, the dedicated test line includes one or more test points for examining the electrical characteristics of the test line. The dedicated test line includes a termination conductor within a termination connector, such that the termination conductor is included in the dedicated test line only when the device connected by the termination connector is properly interconnected with the electrical system.

Thus, the invention of the copending application achieves fault detection and isolation by connecting test equipment to two or more test points in the dedicated test line. In order to simplify the testing operation, it would be desirable to detect and isolate faults while requiring only one connection to the dedicated test line.

SUMMARY OF THE INVENTION

It is an object of the present invention to provide a method and apparatus for detecting an interconnection fault of an automotive electrical system including a wiring harness after final assembly of the harness with the electrical system devices.

It is another object of the invention to provide uncomplicated and reliable means for testing the interconnection of a wiring harness system including connections between the termination connectors of the wiring harness and the electrical components of the vehicle electrical system, while requiring only one point of interconnection between the test equipment and the wiring harness system being tested.

It is a further object of the invention to provide a method and apparatus for isolating the location of detected faults.

It is still another object of the invention to provide an automotive electrical system which can conveniently be tested after final assembly, during later servicing of the vehicle, and even during vehicle use.

These and other objects are achieved according to the present invention by sensing characteristics of the dedicated test line using a time-domain reflectometry technique. Thus, a test signal pulse is applied to one end of the test line. As the pulse travels down the test line, pulse energy is reflected back toward the first end when an increase in test line impedance is encountered (such as at an unconnected connector). The time between the application of the pulse to the test line and any reflected signal is measured. The reception of a pulse indicates the presence of a disconnected connector and the time at which the reflected signal appears indicates the location of the fault (except the pulse reflection from the actual end of the test line). Since the dedicated test line is not loaded by any vehicle devices, it is a high impedance line and is compatible with time-domain reflectometry techniques.

The magnitude of reflection corresponding to a particular time delay can also be measured to indicate the state of a corresponding connector in the test line. Changes in this measurement over time can be used to detect any changes or deterioration in a connector.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

FIG. 10 is table showing the magnitude of reflected signal from a particular connector which changes over time.

DETAILED DESCRIPTION OF PREFERRED EMBODIMENTS

Figure 1:
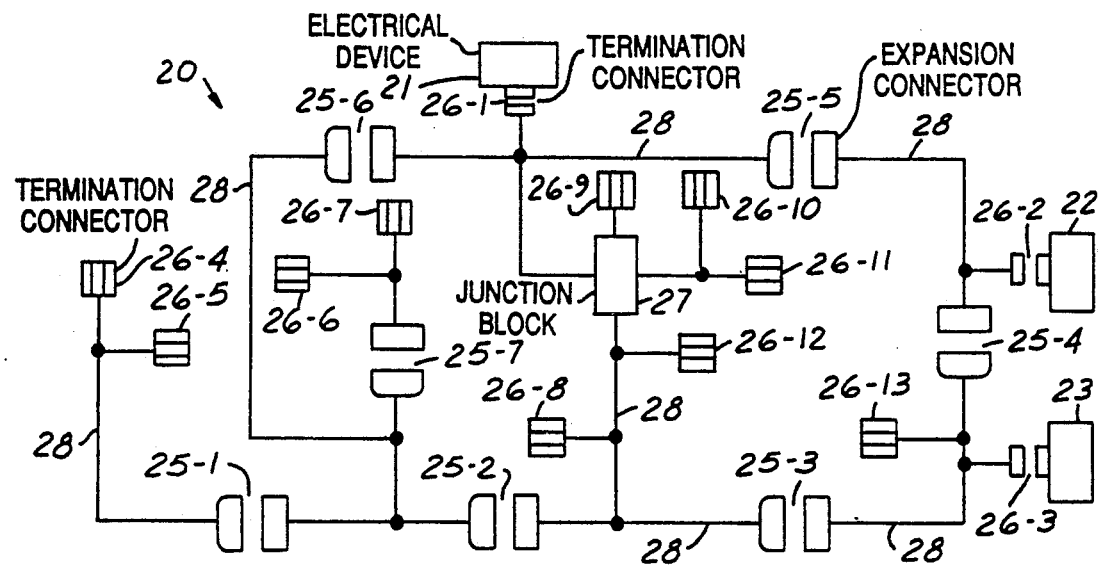
FIG. 1 is a diagram representing a portion of an automotive electrical system including a wiring harness system and termination devices.

FIG. 1 represents an automotive electrical system 20 including electrical system loads or supplies 21, 22, and 23, generally illustrative of various electrical components such as a radio, vehicle lighting, electric motors, or a voltage regulator. Since devices 21-23 are connected to the vehicle wiring harness through respective termination connectors 26-1, 26-2, and 26-3, each device is referred to as a termination device.

A wiring harness interconnects devices 21-23 and other devices (not shown for clarity of the drawing). The wiring harness includes a plurality of harness segments each comprised of a wire bundle, some of which are indicated at 28. Segments 28 are interconnected using expansion connectors 25. Termination connectors 26 interconnect the wiring harness with the termination devices of the electrical system. For example, a termination connector 26-1 interconnects termination device 21 with the wiring harness.

The wiring harness further includes a junction block 27 which connects through expansion connectors to harness segments 28 and which connects directly to some termination devices as shown. Segments 28 are shown as single lines although each contain a plurality of individual wires, some of which may leave the wire bundle at the several junction points.

Figure 2:
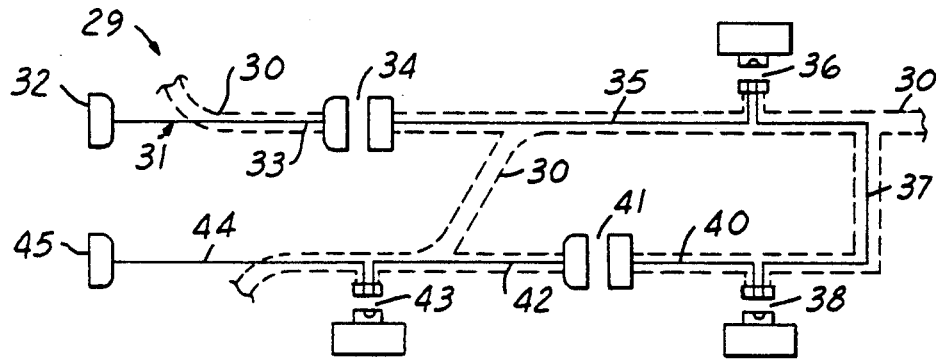
FIG. 2 is a diagram representing a portion of an automotive electrical system having a dedicated test line incorporated therein.

FIG. 2 represents a portion of an automotive electrical system 29 including a wiring harness 30 and a dedicated test line 31 according to the present invention. Dedicated test line 31 includes a first test point 32 connected to a first harness conductor 33 which enters wiring harness 30 and interconnects with an expansion connector 34. Dedicated test line 31 has corresponding connection pins mating in expansion connector 34 and continues with harness conductor 35. A termination connector 36 receives conductor 35 and provides a feed-through of the dedicated test line 31 to a harness conductor 37 when the termination device at termination connector 36 is properly interconnected. Harness conductor 37 feeds through another termination connector 38 only when its termination device is correctly interconnected. Dedicated test line 31 continues in a similar manner through a harness conductor 40, an expansion connector 41, a harness conductor 42, and a termination connector 43. After feeding through termination connector 43, dedicated test line 31 includes a harness conductor 44 extending to a second test point 45. Thus, there is a continuous electrical path from test point 32 to test point 45 only when each connector having dedicated test line 31 passing therethrough is properly interconnected.

As described in copending application Ser. No. 07/504,501, the proper interconnection of the electrical system can be tested by monitoring an electrical characteristic, such as continuity, of dedicated test line 31. Preferably, the portion of wiring harness 30 which includes dedicated test line 31 corresponds to the portions of the electrical system which are considered critical to operation of the vehicle and failure of which would cause the vehicle to quit or operate in an unacceptable manner.

Figure 3:
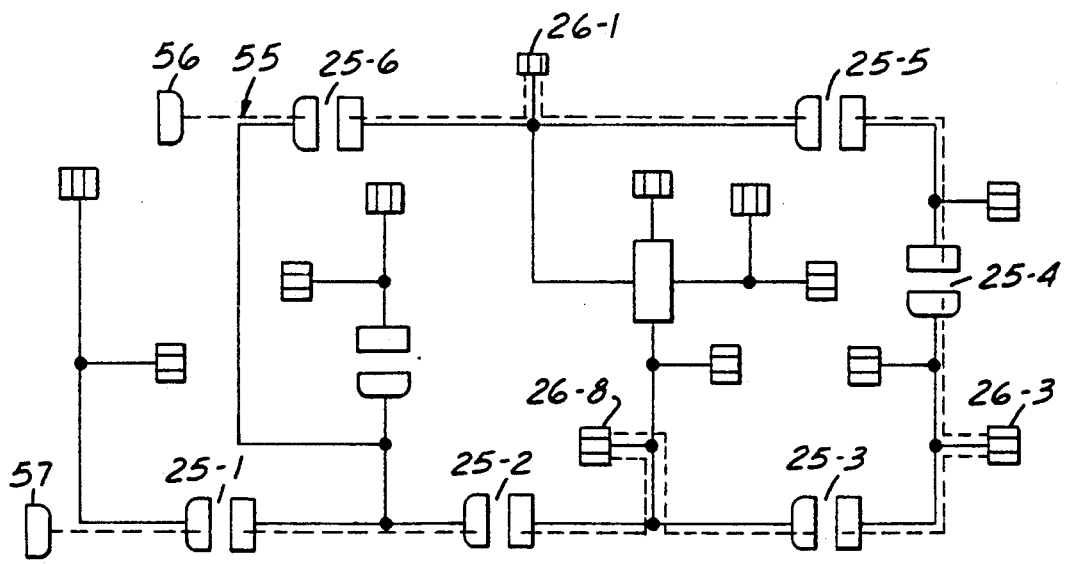
FIG. 3 is a diagram showing the addition of a dedicated test line to the electrical system shown in FIG. 1.

FIG. 3 illustrates the inclusion of a dedicated test line 55 into the electrical system of FIG. 1. Thus, dedicated test line 55 may extend from a first test point 56 and through critical electrical system components, including expansion connector 25-6, termination connector 26-1, expansion connector 25-5, expansion connector 25-4, termination connector 26-3, expansion connector 25-3, termination connector 26-8, expansion connector 25-2, and expansion connector 25-1, to a second test point 57.

Figure 4:
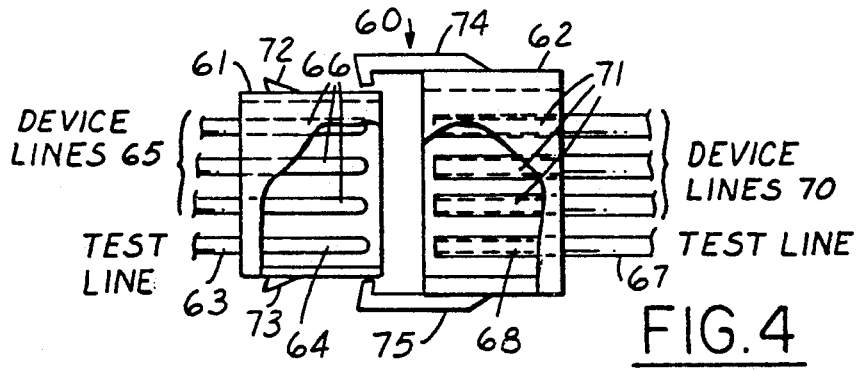
FIG. 4 is a cross-sectional view of an expansion connector containing a dedicated test line according to the present invention.

FIG. 4 shows one embodiment of a pin and socket expansion connector useful in the present invention. An expansion connector 60 includes a first end 61 and a second end 62. First end 61 receives a test line harness conductor 63 which is connected to a terminal pin 64. Standard device lines 65 of the wiring harness are connected to terminal pins 66. Second end 62 is connected to a test line harness conductor 67 which is joined to a terminal socket 68. Device lines 70 are connected to terminal sockets 71. Insertion of expansion connector ends 61 and 62 results in interconnection of the corresponding pins and sockets. On full insertion, expansion connector ends 61 and 62 are interlocked by means of projections 72 and 73 on first end 61 being received by locking tabs 74 and 75 on second end 62.

Figure 5:
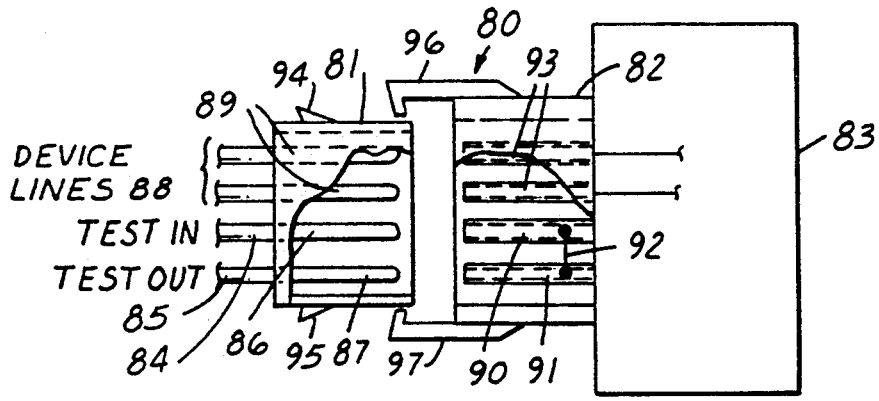
FIG. 5 is a cross-sectional view of a termination connector containing a dedicated test line according o the present invention.

FIG. 5 shows a termination connector according to one embodiment of the present invention. A pin and socket termination connector 80 includes a first end 81 at the harness end of the connector and a second end 82 which is at the device end of the connector and which is integral with a termination device 83. A harness conductor 84 provides a dedicated test line into termination connector 80 and is connected to a terminal pin 86. A harness conductor 85 provides a dedicated test line out of termination connector 80 and is connected to a terminal pin 87. Device lines 88 from the wiring harness are connected to terminal pins 89.

A terminal socket 90 and a terminal socket 91 in second connector end 82 are joined by a termination conductor 92 for feeding through the dedicated test line between harness conductors 84 and 85 when termination conductor 80 is properly interconnected. Upon full insertion of the harness end and the device end of termination connector 80, the connector is locked by means of projections 94 and 95 on first connector end 81 and locking tabs 96 and 97 on second connector end 82.

Figure 6:
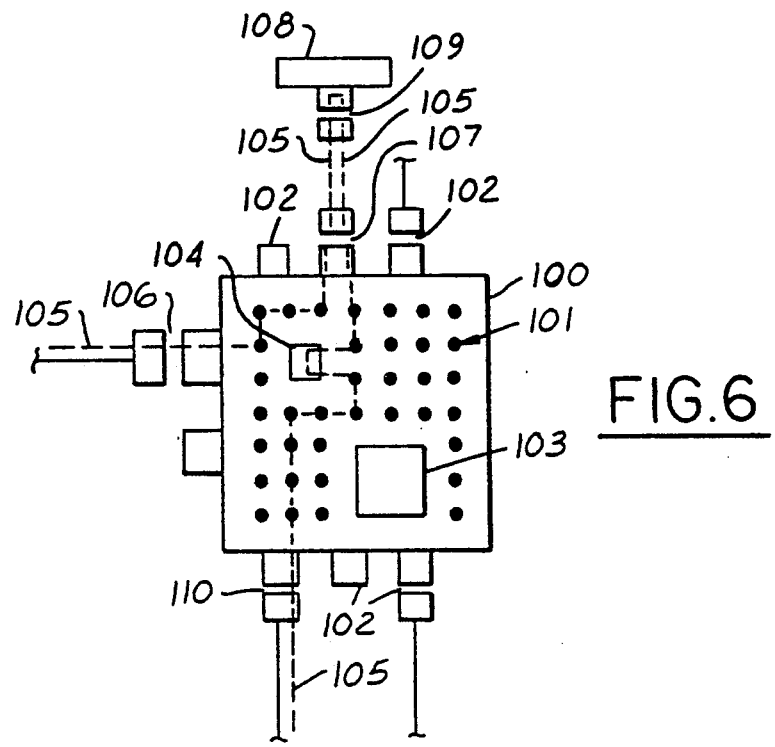
FIG. 6 is a plan view of a junction block containing a dedicated test line according to the present invention.

FIG. 6 shows a junction block 100 which may be included in the electrical system of the present invention. Junction block 100 is comprised of an integral molded block including conductors and interconnection points 101. Junction block 100 also includes a plurality of expansion connectors 102. Likewise, termination devices 103 and 104 are connected directly to junction block 100.

Junction block 100 further includes a dedicated test line 105 passing therethrough. Dedicated test line 105 is included in expansion connector 106 and passes into junction block 100. By means of a conductor integral with junction block 100, dedicated test line 105 passes into an expansion connector 107 and through termination connector 109 including a termination device 108. Dedicated test line 105 reenters junction block 100 through expansion connector 107 and passes through termination device 104 before exiting junction block 100 through an expansion connector 110.

Figure 7:
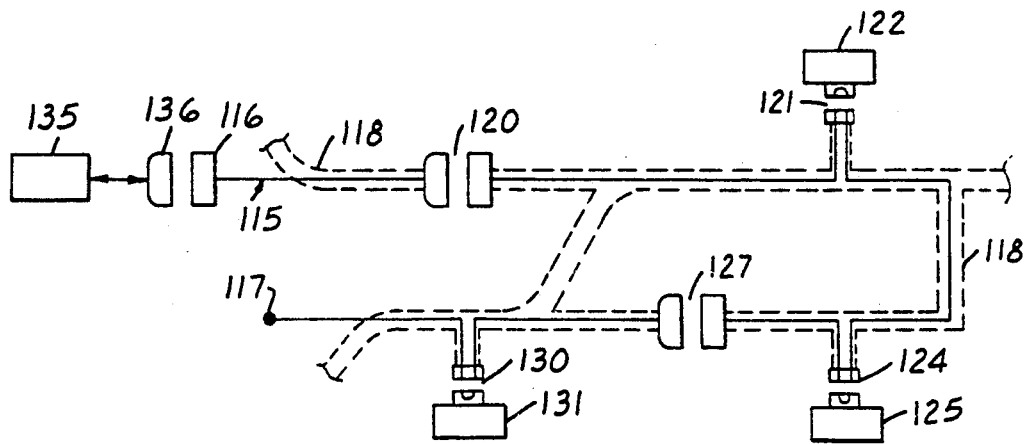
FIG. 7 is a diagram showing a test apparatus of the present invention connected to a dedicated test line.

A time-domain reflectometry fault detection and isolation system of the present invention is shown in FIG. 7. A dedicated test line 115 extends between a first test point 116 and a test line termination 117. From test point 116, dedicated test line 115 enters a wiring harness 118 and passes through an expansion connector 120, a termination connector 121, a termination connector 124, an expansion connector 127, and a termination connector 130 in the manner previously described.

To isolate any faults occurring in the interconnection of the connectors having dedicated test line 115 passing therethrough, a time-domain reflectometer 135 is connected to test point 116 through a test probe 136. A time-domain reflectometer is a known device which typically displays a test signal pulse and the time-delayed reflected components of the test signal on a time-calibrated oscilloscope. The magnitude of the reflected signal depends on the impedance of the dedicated test line at each successive point. Since the impedance of the dedicated test line is very low, except at the site of a disconnected connector, a significant reflected signal is received only from a disconnected connector or from the end of the dedicated test line if there are no unconnected connectors. Since the length of dedicated test line 115 from test point 116 to each connector and to end 117 of test line 115 is known, the signal propagation time for travel to and reflection from each connector or end point 117 is known. Therefore, the time of reception of a reflection signal can be compared with known time delay ranges to determine the interconnection state of connectors included in dedicated test line 115 and thus the critical system components in the portion of the electrical system being tested.

Figure 8:
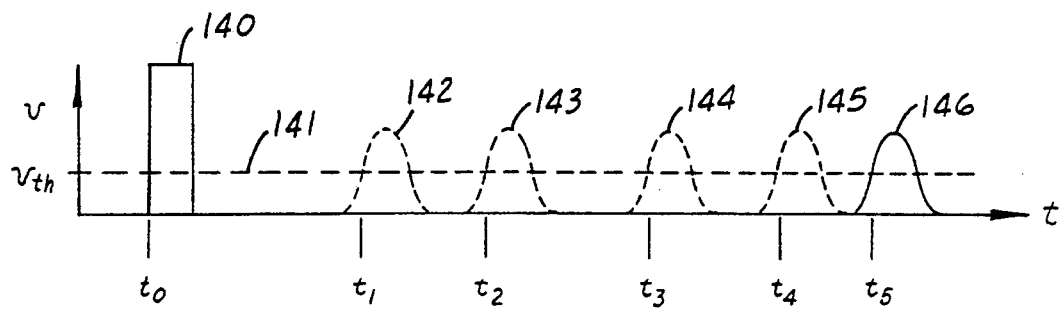
FIG. 8 is a waveform diagram of a transmitted test pulse and received signal reflections.

FIG. 8 shows a test pulse 140 occurring at a time $t_0$ and having a voltage magnitude greater than a threshold voltage $v_{th}$ shown extending across the diagram at dashed line 141.

After transmission of the test pulse signal, the time-domain reflectometer applies a time dependent gain to the signal received from the dedicated test line in order to compensate for the signal decay due to the impedance of the conductor line itself. Thus, variations in the received signal correspond substantially only to undesired impedances (e.g., discontinuities) in the dedicated test line. For example, in the event that expansion connector 120 in FIG. 7 is improperly connected, such that dedicated test line 115 is not completed past connector 120, a reflected signal 142 is received at a time $t_1$ which exceeds threshold voltage $v_{th}$. A signal reflection 143 at a time $t_2$, a signal reflection 144 at a time $t_3$, and a signal reflection 145 at a time $t_4$ correspond to the possible disconnection of other connectors that may be included in the dedicated test line. The complete disconnection of any single connector causes a zero received reflection from any subsequent connectors in the dedicated test line. Thus, when an improperly connected connector is identified using the present invention, it will be necessary to retest the dedicated test line after correcting the identified fault. Testing and correction should proceed until the reflection from the end of the test line is identified.

If all connectors in the electrical system which includes the dedicated test line are properly connected, a signal reflection 146 will be received at a known time $t_5$ corresponding to the end of the dedicated test line. Thus, the proper interconnection or the location of a fault in the wiring harness are determined. More specifically, each delay time $t_1$ to $t_5$ defines a respective time slot or range which is correlated with a respective connector.

Figure 9:
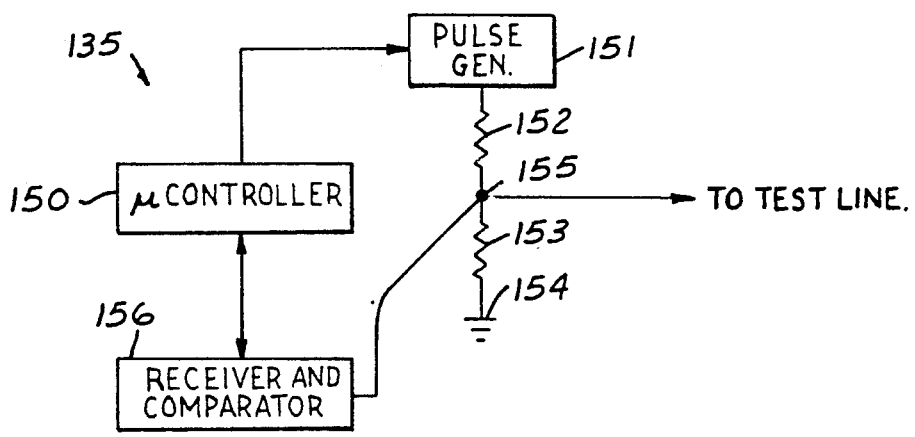
FIG. 9 is a schematic diagram showing an embodiment of the test apparatus in greater detail.

One embodiment of time-domain reflectometer 135 not employing an oscilloscope is shown in FIG. 9. A microcontroller 150 is connected to a pulse generator 151 and to a receiver and comparator circuit 156. Microcontroller 150 is programmed to conduct test sequences and to analyze results of test sequences. Reflectometer 135 can be provided as a separate test device connected to the dedicated test line only during testing which is conducted after final assembly or during vehicle service. Alternatively, reflectometer 135 employing microcontroller 150 could be provided as a permanent part of a vehicle to provide testing during vehicle usage.

Pulse generator 151 has an output connected to a series pair of resistors 152 and 153 connected to ground 154. Junction 155 between resistors 152 and 153 is connected to the dedicated test line and to an input of receiver and comparator circuit 156.

To initiate a test sequence, pulse generator 151 generates a test pulse signal in response to a command signal from microcontroller 150. A test pulse signal travels from junction 155 down the dedicated test line and is reflected back to junction 155 by any discontinuities or jumps in test line impedance. Received signal reflections are time-gain amplified by receiver and comparator circuit 156 (i.e., the input signal from the test line is applied to an amplifier having a gain which increases with time to compensate for signal losses due to the increased distance traveled by later signals). The time-gain amplified signal is compared to a threshold voltage and the reception of a signal reflection greater than the threshold voltage is indicated to microcontroller 150. The time delay between the generation of the test pulse signal and the reception of a reflection having a magnitude greater than the threshold voltage is measured by microcontroller 150 and compared to the known time ranges corresponding to each respective connector or end of the dedicated test line. A signal reflection corresponding to a disconnected connector causes microcontroller 150 to indicate a fault by illuminating a warning light, for example. The identity of the failed connector can also be displayed and/or stored for later retrieval.

In an alternative embodiment of the present invention, receiver and comparator 156 continuously monitors the magnitude of the received signal reflection, that magnitude being further provided in a digital format to microcontroller 150. Thus, microcontroller 150 is able to estimate the impedance occurring at any point along the dedicated test line by determining the magnitude of signal reflection at a particular delay time. By conducting test sequences for a particular connector at different times (e.g., once per vehicle start-up), microcontroller 150 can determine any changes in impedance of the dedicated test line corresponding to the particular connector. Thus, any degradation in the connection at the particular connector can be sensed. It is thus possible to provide a warning of an impending failure of a connector before complete failure occurs.

As shown in FIG. 10, a plurality of time-separated measurements can be made corresponding to discrete time slots centered around delay times $t_1$ to $t_5$ which each correspond to particular connectors in the dedicated test line. In particular, a measurement $m_1$ is conducted and the received magnitude of signal reflection at time $t_1$ is 0.1 in arbitrary units. At a later time (such as after the next engine start), a measurement $m_2$ is taken which indicates that there has been no change in the impedance at the corresponding connector. However, as the connector pins in the corresponding connector begin to corrode or degrade for any other reason, measurements $m_3$ to $m_6$ indicate an increase in the dedicated test line impedance in the area of the connector under test. When the impedance or reflected signal magnitude corresponding to time slot $t_1$ increases above a threshold value, a warning is presented to the driver of the vehicle (by means of microcontroller 150) so that corrective action may be taken.

Although the time-domain reflectometer of the present invention has been described primarily in terms of an electrical test line, it is possible to utilize an optical test line in a similar manner. Light pulses generated by a light emitting diode, for example, would be reflected at discontinuities or disconnects in the test line. Reflections could be converted to electrical signals by an optical sensor, such as a photoconductive cell or a phototransistor.

While preferred embodiments of the invention have been shown and described herein, it will be understood that such embodiments are provided by way of example only. Numerous variations, changes, and substitutions will occur to those skilled in the art without departing from the spirit of the invention.

What is claimed is:

1. An automotive electrical system comprising:
   a plurality of electrical components including at least one termination device;
   a wiring harness system interconnecting said electrical components and including a plurality of harness conductors and a plurality of connectors, one of said connectors being a termination connector connected to said termination device, said wiring harness system including a dedicated test line provided by a termination conductor disposed in said termination connector and provided by more than one of said harness conductors, said dedicated test line extending between a test point and a test line termination;
   driving means connected to said test point for applying a test signal pulse to said dedicated test line at said test point;
   receiving means connected to said test point for sensing a resulting time-delayed signal at said test point in response to said test signal; and time measuring means connected to said driving means and said receiving means for measuring a time period between the application of said test signal pulse and the reception of said resulting signal as a reflection of said pulse.

2. The electrical system of claim 1 wherein said dedicated test line is comprised of electrical harness conductors and wherein said test signal pulse is an electrical signal.

3. The electrical system of claim 1 wherein said dedicated test line is comprised of optical harness conductors and wherein said test signal pulse is an optical signal.

4. The electrical system of claim 1 further comprising signal measuring means connected to said driving means and said receiving means for measuring the magnitude of a reflected signal during a time period determined by said time measuring means and corresponding to the impedance of said dedicated test line at the location of one of said connectors.

5. A method for isolating a fault in the interconnection of an automotive electrical system, said method comprising the steps of:
providing a plurality of electrical components including at least one termination device;
interconnecting said electrical components using a wiring harness system including a plurality of harness conductors and a plurality of connectors, one of said connectors being a termination connector connected to said termination device;
providing a dedicated test line in said wiring harness system including a termination conductor disposed in said termination connector, said dedicated test line further including more than one of said harness conductors;
providing a test point at one end of said dedicated test line and a test line termination at the opposite end of said dedicated test line;
injecting a test signal pulse at said test point; and
measuring a time delay for a reflection of said test signal pulse to arrive at said test point following the injection of said test signal pulse, such reflection corresponding to an interconnection fault or said test line termination.

6. The method of claim 5 wherein said dedicated test line is comprised of electrical conductors, said test signal pulse being an electrical pulse.

7. The method of claim 5 wherein said dedicated test line is comprised of optical conductors, said test signal pulse being an optical pulse.

8. The method of claim 5 wherein said dedicated test line follows a path including termination connectors for a plurality of critical electrical components in said electrical system.

9. The method of claim 5 further comprising the step of comparing the measured time delay to known time delays corresponding to each connector in said electrical system to identify the location of a fault.

10. The method of claim 5 further comprising the steps of:
repeating said injecting and measuring steps at a later time;
comparing the results from said measuring step for different times; and
predicting a failure of said electrical system in response to an unequal comparison in said comparing step.

11. A method for isolating a fault in the interconnection of an automotive electrical system, said method comprising the steps of:
providing a plurality of electrical components including at least one termination device;
interconnecting said electrical components using a wiring harness system including a plurality of harness conductors and a plurality of connectors, one of said connectors being a termination connector connected to said termination device;
providing a dedicated test line in said wiring harness system including a termination conductor disposed in said termination connector, said dedicated test line further including more than one of said harness conductors;
providing a test point at one end of said dedicated test line;
injecting a test signal pulse at said test point;
determining a time slot corresponding to an arrival time of a reflection of said test signal pulse at said test point from a selected one of said plurality of connectors; and
measuring a magnitude of said reflection during said time slot to indicate the proper interconnection of said selected one of said connectors.

12. The method of claim 11 further comprising the steps of:
repeating said injecting, determining, and measuring steps at a later time for said selected one of said connectors;
comparing said measured magnitude for each of said times; and
indicating an impending failure of said selected one of said connectors when said measured magnitude changes by a predetermine magnitude.

* * * * *